United States Patent [19]

Kadokura

[11] Patent Number: 5,234,558

[45] Date of Patent: Aug. 10, 1993

[54] ELECTRICALLY CONDUCTIVE CIRCUIT MEMBER, METHOD OF MANUFACTURING THE SAME AND ELECTRICALLY CONDUCTIVE PASTE

[75] Inventor: Susumu Kadokura, Sagamihara, Japan

[73] Assignee: Canon Kabushiki Kaisha, Tokyo, Japan

[21] Appl. No.: 673,072

[22] Filed: Mar. 21, 1991

[30] Foreign Application Priority Data

| Mar. 22, 1990 | [JP] | Japan | 2-69823 |
| Mar. 22, 1990 | [JP] | Japan | 2-69824 |
| Mar. 22, 1990 | [JP] | Japan | 2-69825 |
| May 9, 1990 | [JP] | Japan | 2-117497 |

[51] Int. Cl.$^5$ .......................................... C25D 13/12
[52] U.S. Cl. .............................. 204/181.1; 204/180.2; 205/118; 205/188
[58] Field of Search ............... 204/181.4, 181.1, 180.2; 205/125, 118, 188

[56] References Cited

U.S. PATENT DOCUMENTS

| 4,579,882 | 4/1986 | Kanbe et al. | 523/137 |
| 4,751,172 | 6/1988 | Rodriguez et al. | 204/180.2 |
| 4,806,200 | 2/1989 | Larson et al. | 156/652 |
| 4,844,784 | 7/1989 | Suzuki et al. | 204/180.9 |
| 4,891,069 | 1/1990 | Holtzman et al. | 205/125 |
| 5,004,672 | 4/1991 | D'Ottavio et al. | 204/181.1 |

FOREIGN PATENT DOCUMENTS 59-223763 12/1984 Japan.
61-276979 12/1986 Japan.

Primary Examiner—John Niebling
Assistant Examiner—Kishor Mayekar
Attorney, Agent, or Firm—Fitzpatrick, Cella, Harper & Scinto

[57] ABSTRACT

An electrically conductive circuit member, a method for manufacturing the same, and an electrically conductive paste in which the electrically conductive circuit member has an electrically conductive circuit forming a pattern on an insulating substrate. The electrically conductive circuit includes an electrodeposited film containing electrically conductive particles and resin which can be electrically deposited.

9 Claims, 3 Drawing Sheets

ELECTRICALLY CONDUCTIVE CIRCUIT MEMBER, METHOD OF MANUFACTURING THE SAME AND ELECTRICALLY CONDUCTIVE PASTE

BACKGROUND OF THE INVENTION

1. Field of the Invention

The present invention relates to electrically conductive paste and an electrically conductive circuit member of a printed circuit board for use in an optical device such as cameras, office machines, audio products, OA equipment, home electric products, meters and communication devices.

2. Description of the Prior Art

Hitherto, electrically conductive circuits have been formed in a solid phase-gas phase system on an insulating substrate by an evaporation method, an ion plating method, a CVD method and a sputtering method. Electrically conductive circuits have also been formed in a solid phase-liquid phase system by a plating method, a metal soldering method and a metal-oxide solder method. Furthermore, these circuits have been formed in a solid phase-solid phase system by a DC voltage application method and a pressing and heating method.

However, the above-described conventional methods of forming a circuit encounter the following problems:

The evaporation method and the sputtering method employed in a solid phase-gas phase require use of an expensive vacuum apparatus. Further, the type of the substrates which may be employed are limited, causing problems such that the overall cost cannot be reduced and mass production cannot easily be performed. Furthermore, since the circuit is formed at high temperature, use of the above-described methods is limited to substrates possessing sufficient heat resistance.

It is necessary for each of the plating methods, the metal soldering method and the metal-oxide mixture soldering method to make the thickness of the plating layer, which serves as the pattern, 18 μm or greater. Therefore, it takes an extended time to complete the film formation, preventing satisfactory production levels. Therefore, the overall cost cannot be reduced. Furthermore, the solder method is arranged in such a manner that silver powder, amorphous carbon powder or graphite powder is mixed with a binder such as phenol resin, epoxy resin, polyester resin or acrylic resin so that a desired pattern is screen-printed via a mask. However, that printing method encounters a problem in that the obtainable resolution is 150 μm or lower. Therefore, it cannot be employed in an apparatus such as a lap top computer because the size, weight and thickness cannot be reduced, or the circuit realized in the form of a card. Further, another problem arises in that the displayed quality is unsatisfactory and reproducibility is insufficient. For example, bleeding, blurs and insufficiency of the functional component, which take place in the printed film cannot be prevented. Finally, since the screen mask pattern can be undesirably plugged, the quality will be deteriorated.

In addition, the thickness of the formed film cannot be equalized if the squeezing pressure or the squeezing speed is changed. In consequence, sharp forms cannot be realized and the reproducibility also becomes unsatisfactory, causing reduced quality of the product.

Furthermore, a satisfactory positional accuracy cannot be obtained in the printing pattern, and the high temperature of 150° C. or higher is necessary to harden the film. Therefore, the substrate will become warped or twisted, and a dimensional problem exists, causing deterioration of the ability and efficiency of connection to the adjoining parts when assembled. As a result, a critical problem arises in that the cost cannot be reduced and a satisfactory efficiency in the mass production cannot be realized.

Furthermore, since the above-described paste contains a toxic organic solvent, a risk of contaminating the working space or fire hazard cannot be overcome.

The high melting metallizing method is usually employed in the solid phase-solid phase system. However, that method forms the circuit at high temperature similarly to the solid phase-gas phase method. Therefore, the application is limited to a substrate such as a ceramic plate which reveals sufficient heat resistance and dimensional stability.

SUMMARY OF THE INVENTION

Accordingly, an object of the present invention is to provide an electrically conductive circuit member the thickness of which can be reduced and which reveals a satisfactory adhesion of the circuit to the substrate and satisfactory electrical conductivity.

Another object of the present invention is to provide a method of manufacturing an electrically conductive circuit member having an extremely precise circuit pattern formed thereon while maintaining an excellent positional accuracy.

Another object of the present invention is to provide electrically conductive paste revealing an excellent electrical conductivity and it can thereby be used to form a fine pattern circuit.

Another object of the present invention is to provide electronic equipment the size and the weight of which can be reduced and which is free from the occurrence of defects in the electrically conductive circuit thereof.

According to one aspect of the present invention, there is provided an electrically conductive circuit member having an electrically conductive circuit forming a pattern on an insulating substrate, the electrically conductive circuit member comprising: an electrodeposited film containing electrically conductive particles and resin which can be electrically deposited.

According to another aspect of the present invention, there is provided a method of manufacturing the above-described electrically conductive circuit member having an electrically conductive circuit in a pattern on an insulating substrate comprising performing an electrodeposition while simultaneously immersing an insulating substrate into electrically conductive paste containing a resin and electrically conductive particles, which can be electrically deposited onto the surface of the insulating substrate to selectively form on said insulating substrate an electrodeposited film containing the resin and the electrically conductive particles; and conducting a heating and hardening process.

According to another aspect of the present invention, there is provided electrically conductive paste comprising: from about 3 to 50 wt % of a resin which can be electrically deposited; and from about 4 to 80 wt % of electrically conductive particles.

According to another aspect of the present invention, there is provided electronic equipment comprising: an electrically conductive circuit member having an electrically conductive circuit forming a pattern on an insulating substrate; said electrically conductive circuit member comprising an electrodeposited film which contains resin which can be electrically deposited and electrically conductive particles.

An electrodeposited film is formed by simultaneous deposition of the resin and the electrically conductive particles only on the circuit pattern as a result of the electrodeposition. Therefore, an excellent circuit substrate, revealing a uniform thickness of the formed film can be obtained while preventing defects such as bleeding, blurs and deficiency of a necessary component of the circuit.

Furthermore, since the electrically conductive particles deposit in the electrodeposited film at high density, the electric characteristics can further be improved. In addition, since the circuit pattern is formed by a photolithographic process, a circuit substrate having an extremely precise circuit pattern formed thereon can be obtained.

In addition, since the resin and the electrically conductive particles are deposited due to electrophoresis, a desired film can be formed by smaller energy and in a shorter time in comparison to plating method. Therefore, an electrically conductive circuit member having a precise pattern formed thereon and revealing excellent physical properties can easily be manufactured.

Other objects, features and advantages of the invention will be appear more fully from the following description.

DESCRIPTION OF THE PREFERRED EMBODIMENTS

Preferred embodiments of the present invention will now be described with reference to the drawings.

FIGS. 1A to 1E illustrate an example of a method of manufacturing an electrically conductive circuit member according to the present invention. Referring to FIG. 1, a catalytic layer 2 is formed on an insulating substrate 1 by a catalytic process. Successively, an electroless plating layer 3 is formed on the catalytic layer 2 by electroless plating (see FIG. 1A).

Figure 1A:
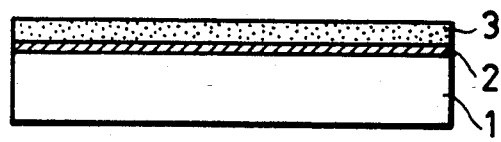
FIG. 1 illustrates an embodiment of a method of manufacturing an electrically conductive circuit member according to the present invention.
Figure 1B:
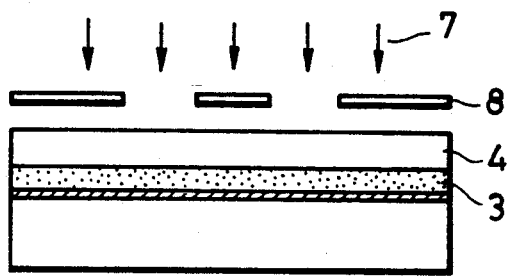
Figure 1C:
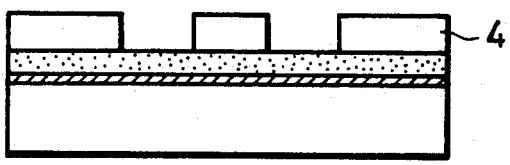
Figure 1D:
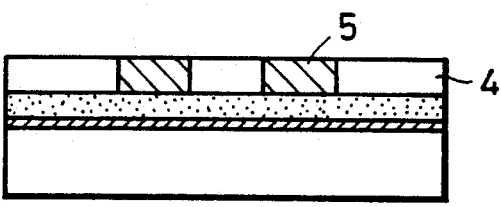
Figure 1E:
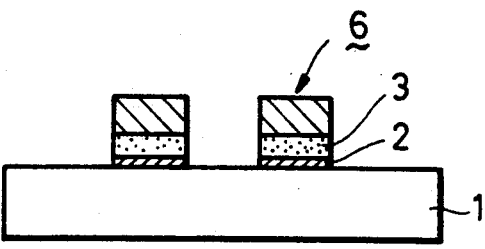

Subsequently, the electroless plating layer 3 is coated with a photosensitive resin 4 before a light beam 7 is applied thereto via a pattern mask 8 (see FIG 1B). A resist pattern corresponding to a desired circuit pattern is formed after a development process has been performed (see FIG. 1C). Then, the insulating substrate 1, having the above-described resist pattern formed thereon, is immersed into an electrically conductive paste which contains a resin and electrically conductive particles so as to be subjected to electrophoresis, the resin being electrically depositable. In consequence, an electrodeposited layer 5 is formed (see FIG. 1D). Subsequently, the thus processed substrate is heated so that the electrodeposited film 5 is hardened before the photosensitive resin 4 is separated from the substrate. Then, the plating layer 3 formed in portions, except for the portions on which the electrodeposited film 5 has been formed, is removed by etching so that an electrically conductive circuit member according to the present invention and having a circuit 6, the major portion of which is made of the electrodeposited film 5, can be obtained (see FIG. 1E).

The circuit according the present invention is formed by the electrodeposited film 5 which has deposited a high density of the electrically conductive particles together with the resin which can be electrically deposited. In consequence, a circuit thus formed reveals an excellent electrical conductivity and a precise structure with a satisfactory positional accuracy, although its thickness is reduced since it can be formed by photolithography. Furthermore, the present invention is different from conventional methods in that the electrically depositing process is employed. Therefore, the film having a constant thickness can be formed at low voltage.

The present invention is not limited to the electrically conductive particles serving as the eutectoid formed on the electrodeposited film. However, it is preferable to use powder (hereinafter called "metallized ceramic powder") manufactured by plating a metal on the surface of ceramic powder or powder (hereinafter called "metallized natural mica" or "metallized mica powder") manufactured by plating a metal on the surface of natural mica powder. The reason for this is that the electrodeposited film can be perfectly hardened by a low temperature of from about 90° C. to 100° C. The reason why the electrodeposited film containing the above-described powder can be hardened at the low temperature has not been discovered. However, it can be considered that the metallized ceramic or the metallized natural mica powder enables the electrodeposited film to be easily hardened because the metallized ceramic and the metallized natural mica powder can stably maintain the active surfaces of the particles, in a different manner from the ordinary metal powder which is easily oxidized on its surface, the active surfaces of the particles serve as crosslinking points at the time of the hardening operation. The metallized natural mica or the metallized ceramic powder may comprise powder formed by plating a metal, for example, Ag, Ni, Cu, Au or Sn to the surface of the ceramic particles.

The preferable average particle size of the ceramic power and the natural mica powder is from about 0.1 to 7 μm, preferably about 0.5 to 5 μm, when measured by a centrifugal decanter SACP-3 manufactured by Shimazu, in order to the facilitate the dispersion of the powder in the electrically conductive paste.

The ceramic according to the present invention is exemplified by aluminum oxide, titanium nitride, manganese nitride, tungsten nitride, tungsten carbide, lanthanum nitride, aluminum silicate, molybdenum disulfide, titanate oxide, graphite and silicic acid. The natural mica is exemplified by phologopite, sericite and muscovite.

It is preferable to use nickel or copper to apply as the plating on the surface of the ceramic powder or the natural mica so that the sealing performance is improved. Furthermore, it is preferable to employ an electroless plating method to plate the surface of the ceramic. The thickness of the plating to be applied to the surface of the powder should be from about 0.05 to 3

μm, preferably about 0.15 to 2 μm so that excellent sealing performance can be obtained and as well as satisfactory physical properties can be displayed when it is hardened at low temperature. That is, if the thickness of the plating is larger than 3 μm, the displayed characteristics of the surface becomes similar to those of the metal particles which display an extremely low activity. Therefore, the surface is oxidized in air, causing the number of the active points engaging in crosslinking to be reduced. In consequence, the electrodeposited film cannot satisfactorily be hardened or heated when it is burned or heated at low temperature.

The quantity of the electrically conductive particles contained in the electrodeposited film serving as the circuit of the electrically conductive member according to the present invention is arranged to be from about 20 to 80 wt %, preferably about 20 to 50 wt % so as to obtain excellent electrical conductivity and to enable the coated film to have satisfactory physical properties, and, in particular, to realize excellent contact with the base material.

The quantity of the metallized ceramic powder can be measured by using an X-ray microanalyzer and an analysis performed in accordance with a thermogravimetric analysis for example, performed on PERKIN-ELMER; Thermal Analysis System 7 Series.

The structure according to the present invention may be arranged in such a manner that both the metallized ceramic powder and the metallized natural mica powder are contained in the electrodeposited film at a mixture ratio which is not limited but both together must be included in the above-described range of the electrically conductive particles in the electrodeposited film. However, it is preferable to make the mixture ratio of the metallic ceramic powder and the metallic mica powder be about 1:1 to 2.5.

Figure 3:
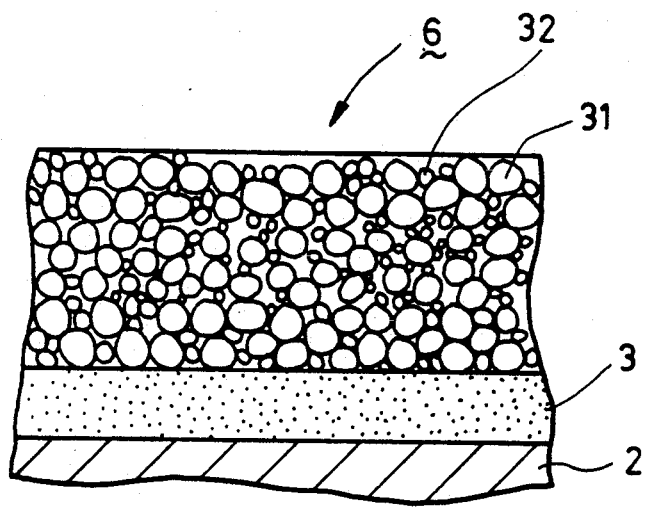
FIG. 3 is an enlarged view which illustrates an electrodeposited film which forms the electrically conductive circuit member according to the present invention.

Furthermore, superfine metal powder, the average particle size of which is from about 0.01 μm to 5 μm, may be added tot eh electrodeposited film in addition to the metallized ceramic powder and/or the metallized mica powder. The present invention is not limited to the type of the superfine metal powder. However, it is exemplified by Ag, Co, Cu, Fe, Mn, Ni, Pd, Sn and Te. It is preferable that the average particle size of the superfine metal powder by about 0.01 to 5 μm, preferably about 0.02 to 5 μm, and more preferably, it is about 0.03 to 0.08 μm. If it is smaller than about 0.01 μm, undesirable secondary aggregation will take place. If it is larger than about 5 μm, the amount of precipitation makes it unsatisfactory. The above-described superfine metal powder can be manufactured by using a heat plasma evaporation method. The mixture ratio of metallized ceramic powder and/or the metallized natural mica and the superfine metal powder is from about 1:0.2 to 3.0, preferably about 1:0.3 to 2.5 so that a gap formed between the metallized ceramic and/or the metallized natural mica 31 is, as shown in FIG. 3, filled with superfine metal powder 32. In consequence, the contact areas between the particles are enlarged, causing the electrically conductivity to further be improved. However, if the quantity of the superfine metal powder to be contained is further increased, the quantity of the metallized ceramic and/or the metallized mica contained in the electrodeposited film is relatively reduced. In consequence, the contact areas between the particles are reduced and the electrical conductivity is thereby deteriorated. Therefore, the formed film does not display the desired physical properties when it is hardened at low temperature. In a case where the electrical conductivity desired by the electrically conductive circuit, for example, a specific resistance ($\Omega$·cm) of an order of $10^{-3}$, preferably $10^{-5}$ is realized, the quantity of the superfine metal powder to be contained must be increased. In this case, the weight ratio of the superfine metal powder with respect to the resin which can be electrically deposited is excessively increased. As a result, the physical properties of the formed film, such as the contact and adhesion to the base material is deteriorated.

When the superfine metal powder is added as described above, it is preferably to activate the surface of the superfine metal powder such that, for example, the oxidized film on the surface of the powder is removed. As an alternative to this, it is effective to process the surface of the superfine metal powder with a surface active agent.

The resin which can be electrically deposited according to the present invention may be ordinary resin which has heretofore been used in electrodeposition. It is exemplified by a resin of a type which is hardened due to a reaction with a hardening agent, for example, acryl-melamine resin, acrylic resin, epoxy resin, urethane resin and alkyd resin. Furthermore, a resin of a type which can be hardened due to a reaction of a double bond in a molecule, for example, a polybutadiene resin and an $\alpha$, $\beta$ ethylenically unsaturated compound is exemplified.

It is preferable to make the thickness of the electrodeposited film from about 7 to 20 μm.

A method of manufacturing the circuit member according to the present invention will now be described in detail.

According to the present invention, an insulating base 1 is made of a resin material or an inorganic material, the resin material being exemplified by a film or a plate made of polyester, acrylic, polyamide, phenol, epoxy or polyimide resin. The inorganic material is exemplified by a ceramic plate. The resin base can preferably be used to form a flexible printed circuit or a multilayer printed circuit board, while the ceramic plate can preferably be used to form a hybrid integrated circuit (IC) substrate.

The thus manufactured insulating substrate is subjected to a catalytic process in accordance with a known method before the electroless plating is applied to form the plating layer 3. However, it is preferable to roughen its surface in order to improve the contact with the insulating substrate before the catalytic process is performed. A method of roughening the surface is exemplified by a treatment with caustic soda, or a mixed solution of chromic acid and sulfuric acid or an organic solvent, a blast process and a liquid honing process.

As the catalytic process, a palladium process can be employed.

The electroless plating may use gold, silver, palladium, nickel, copper, tin and zinc. However, it is preferable to employ copper since it reveals a satisfactory conductivity, the electrodeposited film 6 can easily be adhered to it and its cost can be reduced. Since the plating layer 3 serves as an electrode at the time of the electrodeposition, it is preferable that the thickness be between about 0.1 μm and 1 μm. If the thickness is larger than 1 μm, it takes too long to form the plating layer 3, and, an excessively long time elapses for an ensuing separation process to be completed.

Then, the plating layer 3 is coated with a known photosensitive resin, preferably a dry film or a liquid resist or the like made of a negative or positive type photosensitive resin having an aspect ratio of 1.5 or more. The thickness of the photosensitive resin is determined depending upon a desired density of the circuit, the thickness of the conductor of the circuit and the like. The exposure of the pattern can be performed by using an ordinary glass mask or a film mask and an exposing machine emitting parallel beams or scattered light. The luminous quantity (mJ/cm$^2$) and whether the parallel beams are employed or the scattered light is used are determined depending upon the desired density of the circuit.

Then, a developer which is used to develop photosensitive resin is used to perform the development process. As a developer, for example, trichloroethane is used to develop a solvent type photosensitive resin, while sodium carbonate or the like is used to develop water soluble photosensitive resin.

Subsequently, the base material on which a resist pattern which corresponds to the circuit pattern is immersed in the electrically conductive paste so that the electrodeposition is performed. Then, the electrodeposited film 6 is formed on the exposed plating layer 3 by the electrophoresis.

The above-described electrodeposition process can be performed in accordance with an ordinary electrodeposition coating method which is carried out in such a manner that the substance to be coated, that is, the base material is made to be the positive pole when anion electrodeposition coating is performed. When cation electrodeposition coating is performed by making the base material the negative pole, a stainless steel plate is, for example, used to serve as the opposite pole electrode. The electrodeposition conditions are determined depending upon the density of the electrically conductive particles contained in the electrically conductive paste and the desired characteristics (electrical conductivity, the physical properties of the formed film and the thickness of the formed film) of the electrodeposited film. However, usually, the liquid temperature is about 20° to 27° C., the pH value is about 8.0 to 9.5, voltage to be applied is about 50 to 200 V and the duration of treatment is about 1 to 5 minutes.

After the electrodeposited film has been formed, it is washed with water and is heated so that the electrodeposited film is hardened.

The oven in which the electrodeposited film can be hardened is held at a low temperature of about 90° C. to 100° C. for about 20 to 180 minutes, in a case where the electrically conductive particles are the metallized ceramic powder and/or the metallized natural mica. In a case where ordinary metal powder is used, it is preferable to heat it at about 120° C. to 170° C.

Then, a separating liquid, which can be used to separate the photosensitive resin, is used to separate the photosensitive layer formed on the plating layer 3. The solvent type photosensitive resin is separated by, for example, methylene chloride or an exclusive separating liquid chosen in accordance with the photosensitive resin used. On the other hand, the water soluble photosensitive resin is separated by, for example, from about 1 to 5 wt % caustic soda. Subsequently, the exposed plating layer 3 is removed by an ammonical alkaline copper solution or a ferric chloride solution. As a result, an electrically conductive circuit member 11 on which the circuit is formed by the electrically conductive electrodeposited film can be manufactured.

As described above, the method of manufacturing a circuit member according to the present invention is capable of manufacturing a precise circuit substrate, the pattern of which has a pitch on the order of, for example, 1 μm to several tens of micrometers, which can easily be manufactured while revealing an excellent positional accuracy since its circuit pattern is manufactured by the photolithographic method.

The electrically conductive paste component of electrically conductive circuit member according to the present invention will be described below.

The electrically conductive paste according to the present invention can be prepared by dispersing, in a ball mill for 24 to 35 hours, electrically conductive particles or a resin which can be electrically deposited. It is then diluted with salt water so as to adjust the density of the solid component to be about 60 to 90 wt %.

The quantity of the electrically conductive particles contained in the electrically conductive paste is made to be about 4 to 80 wt %, preferably 7 to 70 wt % so that the electrically conductive particles are of such a quantity which is sufficient to give the electrodeposited film a predetermined electrical conductivity. Furthermore, the precipitation of the electrically conductive particles in the paste can be prevented. The electrically conductive paste contains from about 3 to 50 wt %, preferably 5 to 40 wt % of the resin, which can be electrically deposited so that an electrodeposited film revealing satisfactory physical properties can be formed.

As the electrically conductive particles to be dispersed in the electrically conductive paste, the powder which the eutectoid resin in the electrically conductive film can be used, for example, the above-described metallized ceramic powder and/or the metallized natural mica powder and a material prepared by adding the superfine metal powder, the average particle size of which is 0.01 to 5 μm to the metallized ceramic powder and/or the metallized natural mica powder.

FIGS. 2A to 2E illustrate another embodiment of the method of manufacturing the electrically conductive circuit member according to the present invention. Referring to FIG. 2, the insulating substrate 1 is subjected to a known catalytic process so that the catalyst layer 2 is formed (see FIG. 2A).

Figure 2A:
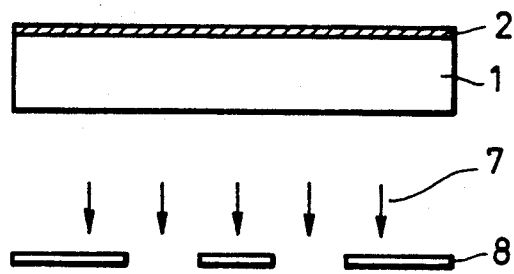
FIG. 2 illustrates another embodiment of the method of manufacturing an electrically conductive circuit member according to the present invention.
Figure 2B:
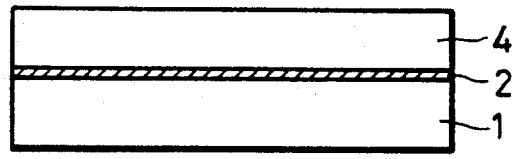
Figure 2C:
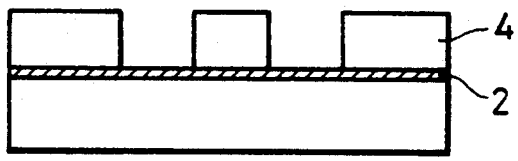
Figure 2D:
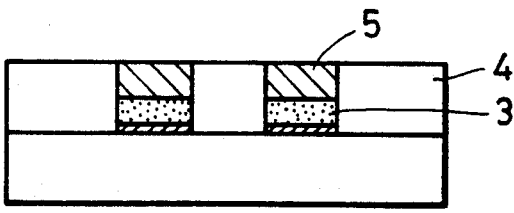

Subsequently, the photosensitive resin 4 is applied before it is exposed to light 7 via the pattern mask 8 (see FIG. 2B). Then, the latent image is developed so that a resist pattern corresponding to a circuit pattern is formed (see FIG. 2C).

Then, the electroless plating is applied to the resist pattern, so that the electroless plating layer 3 is formed. The electrically conductive paste film is then formed by electrophoresis by using the electrically conductive paste 5 (see FIG. 2D).

Figure 2E:
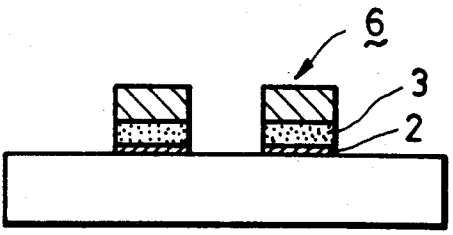

Subsequently, the photosensitive resin 4 except for the circuit pattern portion is separated so that the electrically conductive circuit member according to the present invention can be obtained (see FIG. 2E).

According to the method shown in FIG. 2, the conditions necessary for each of the processes shown in FIG. 1 can be used.

As described above, the electrically conductive circuit member according to the present invention has the electrodeposited film formed on the circuit pattern by the electrodeposition coating method by using the electrically conductive paste liquid. As a result, problems in terms of the non-uniformity, occurrences of bleeding, blurs and insufficiency of necessary components can be overcome. Furthermore, the electric characteristics can be significantly improved so that a member revealing an excellent reproducibility can be formed.

Furthermore, according to the present invention, the electrodeposited layer is formed while forming the circuit pattern by the photolithography process. Therefore, an electrically conductive circuit member having an extremely precise circuit pattern can be easily manufactured. In addition, a desired electrical conductivity can be realized even if the thickness of the electrodeposited film is considerably reduced. Furthermore, an electrically conductive circuit member such as a printed circuit board the size and weight of which are minimized can be manufactured. As a result, the present invention can effectively be applied to electronic equipment.

Figure 4:
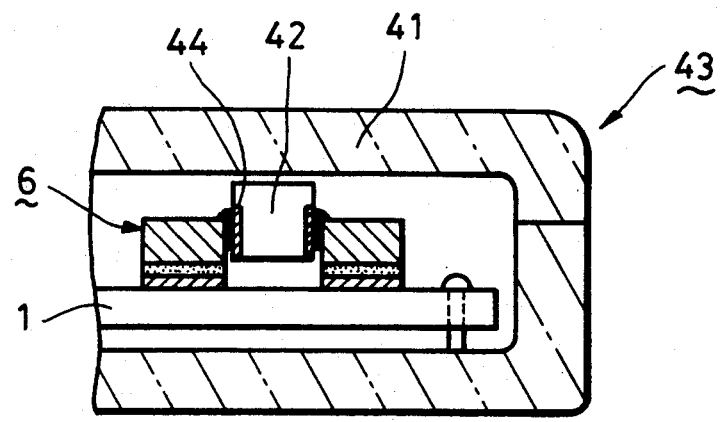
FIG. 4 is a schematic cross sectional view which illustrates electronic equipment which employs the circuit member according to the present invention.

Furthermore, according to the present invention, in the case where the metallized ceramic powder or the metallized natural mica powder is used as the electrically conductive particles, an electrodeposited film revealing excellent physical properties can be formed even if the heating is performed at a relatively low temperature of 90° C. to 100° C. Therefore, a precise circuit can be formed on an insulating substrate, the heat resistance of which is insufficient to endure treatment at higher temperatures, or a thin flexible substrate can be used. As a consequence, an electrically conductive circuit member which can effectively be applied to small and light weight electronic equipment can be obtained. For example, as shown in FIG. 4, a substrate 1 has a circuit substrate having a circuit formed by the electrodeposited film 6 on which an electronic part 42 such as IC. is mounted. Then, that substrate is fixed to a frame 41 so that form factor piece of electronic equipment 43 can be manufactured. Reference numeral 44 represents an electrode of the electronic part.

Furthermore, the overall cost can significantly be reduced since the manufacturing process can be simplified.

EXAMPLES

Examples of the present invention will now be described. However, the present invention is not limited to the examples.

EXAMPLE 1-1

A PET (Polyethylene Terephthalate) film having a thickness of 50 $\mu$m was treated with 50 g/l of caustic soda at 60° C. for 5 minutes. Then, the PET film was treated with a mixed solution of 30 g/l of chromic anhydride and 100 g/l of sulfuric acid at 50° C. for 5 minutes. Subsequently, it was immersed in a catalyst liquid (trade name "HS-101B" prepared by Hitachi Kasei) for 2 minutes so that it was subjected to the catalyst process. Then, nonelectrolytic copper plating liquid (prepared by Okuno) was applied with a plating bath at a temperature of 70° C. and pH value of 13.0, for 5 minutes. In consequence, a copper plating layer having a thickness of 0.2 $\mu$m was formed.

Then, a photosensitive dry film (manufactured by Hoechst A.G.) having a thickness of 70 $\mu$m, was applied to the surface of the plating layer on the PET film by using a laminator (manufactured by Asahi Kasei). Subsequently, a film mask serving as the pattern mask was used to expose the PET film to light at an intensity of 120 mJ/cm$^2$, before it was developed by spraying with 10 g/l of sodium carbonate. In consequence, a pattern was formed corresponding to a circuit pattern arranged in such a manner that the width of the exposed plating layer was 40 $\mu$m and that of the coated portion of the photosensitive layer was 50 $\mu$m.

Then, a voltage of 170 V was applied for 3 minutes in an electrically conductive paste prepared by dispersing 25 wt % of desalinated water, 5 wt % of melamine acryl resin (trade name "Honey Bright C-IL" manufactured by Honey Kasei) and 70 wt % of powder formed by applying nickel plating to form a thickness of 0.2 $\mu$m to the surface of alumina, the average particle size of which was 1.0 $\mu$m, the voltage being applied while making the substrate serve as the positive pole and using a stainless steel electrode (0.5 t) to serve as the opposite pole, at a bath temperature of 23° C. and pH value of 8.5. Then, it was washed with water before being heated in an oven at 95° C.±1° C. for 90 minutes, so as to be hardened.

The film thickness was 25 $\mu$m and the density of the metallized ceramic powder was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

In order to evaluate the performance of the thus manufactured circuit, the initial values and values after environmental testing of the specific resistance, the surface resistance and the adhesion were measured. The results are as shown in Table 1.

As a comparative example 1, a circuit member using a conventional organic solvent type electrically conductive paste was also evaluated, the pitch between the circuits being 100 $\mu$m and the width of the circuit being 100 $\mu$m.

An adhesion test was performed in conformity with JIS K5400 cross-cut adhesion test in such a manner that 100 cross-cut squares were made so as to be subjected to a separation test by using a cellophane tape and the resulting states of the squares were observed. The specific and surface resistances were measured by a superinsulating resistance measuring device (trade name HP4329A manufactured by Yokokawa). The results are as shown in Table 1-1.

TABLE 1-1

Results of the evaluations of the electrically conductive circuit members

| Tests | Initial Value | | After 1000 hours at 55° C. × 95% RH | |
|---|---|---|---|---|
| | Example 1 | Comparative Example 1 | Example 1 | Comparative Example 1 |
| Adhesion | 100/100 | 100/100 | 100/100 | 90/100 |
| Specific Resistance (25° C.) | 5 to 6 × 10$^{-5}$ $\Omega$-cm | 1.0 to 1.3 × 10$^{-4}$ $\Omega$-cm | 2% or Less (Resistance Change) | 2% or Less (Resistance Change) |
| Surface Resistance (25° C.) | 5 × 20 m$\Omega$/square | 50 × 100 m$\Omega$/square | 2% or Less (Resistance Change) | 2% or Less (Resistance Change) |

As shown in Table 1-1, a significant improvement was realized in comparison to the conventional circuit substrate while revealing a sufficient reproducibility.

The circuit according to Comparative Example 1 encountered a problem in terms of a partial bleeding generated in the printed film and a short circuit occurred when the circuit pitch was 100 μm. Furthermore, a pattern having a pitch smaller than 100 μm could not be manufactured by the printing method.

EXAMPLE 1-2

An alumina ceramic plate having a thickness of 0.4 mm was subjected to blasting to an extent such that its surface was not damaged. Subsequently, the alumina ceramic plate was treated with a mixed solution of 30 g/l of chromic anhydride and 100 g/l of sulfuric acid at 50° C. for 5 minutes. Subsequently, it was immersed in a catalyst liquid (trade name "HS-101B" prepared by Hitachi Kasei) for 2 minutes so that it was subjected to the catalyst process. Then, nonelectrolytic copper plating liquid (prepared by Okuno) was used so that it was applied by plating in a plating bath with a temperature of 70° C. and pH value of 13.0 for 3 minutes. In consequence, a copper plating layer having a thickness of 0.1 μm was formed.

Then, a photosensitive dry film (manufactured by Hoechst A.G.) having a thickness of 35 μm was applied to the surface of the plating layer on the alumina ceramic plate by using a laminator (manufactured by Asahi Kasei). Subsequently, a film mask serving as the pattern mask was used to expose the alumina ceramic plate to light at an intensity of 100 mJ/cm$^2$ before it was developed by spraying with 10 g/l of sodium carbonate. In consequence, a pattern corresponding to a circuit pattern arranged in such a manner that the width of the exposed plating layer was 30 μm and that of the coated portion of the photosensitive layer was 40 μm was formed.

Then, a voltage of 180 V was applied for 3 minutes in an electrically conductive paste prepared by dispersing 55 wt % of desalinated water, 5 wt % of melamine acryl resin (trade name "Honey Bright C-IL" manufactured by Honey Kasei) and 40 wt % of powder formed by applying a nickel plating to form a layer thickness of 0.5 μm on the surface of alumina, the average particle size of which was 1.0 μm, the voltage being applied while making the substrate serve as the positive pole and using a stainless steel electrode (0.5 t) to serve as the opposite pole in a bath at a temperature of 23° C. and pH value of 8.5. Then, it was washed with water before being heated in an oven at 95° C.±1° C. for 90 minutes so as to be hardened. The film thickness was 30 μm and the density of the metallized ceramic powder was 60 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

The characteristics of the thus manufactured substrate were evaluated by the same method according to Example 1. The results are as shown in Table 1-2.

EXAMPLE 1-3

A polyimide film having a thickness of 18 μm was treated with 50 g/l of caustic soda at 60° C. for 5 minutes. Subsequently, the polyimide film was treated with a mixed solution of 30 g/l of chromic anhydride and 100 g/l of sulfuric acid at 50° C. for 5 minutes. Subsequently, it was immersed in a catalyst liquid (trade name "HS-101B" prepared by Hitachi Kasei) for 2 minutes so that it was subjected to the catalyst process. Then, electroless copper plating liquid (prepared by Okuno) was applied with the plating bath at the temperature of 70° C. and pH value of 3.0 for 3 minutes. In consequence, a copper plating layer having a thickness of 0.1 μm was formed.

Then, a photosensitive dry film (manufactured by Hoechst A.G.) having a thickness of 50 μm was applied to the surface of the plating layer on the polyimide film by using a laminator (manufactured by Asahi Kasei). Subsequently, a film mask serving as the pattern mask was used to expose the polyimide film to light at an intensity of 90 mJ/cm$^2$ before it was developed by spraying with 10 g/l of sodium carbonate. In consequence, a pattern was formed corresponding to a circuit pattern arranged in such a manner that the width of the exposed plating layer was 35 μm and that of the coated portion of the photosensitive layer was 50 μm.

Then, a voltage of 170 V was applied for 3 minutes in an electrically conductive paste prepared by dispersing 15 wt % of desalinated water, 5 wt % of melamine acryl resin (trade name "Honey Bright C-IL" manufactured by Honey Kasei) and 80 wt % of powder formed by applying nickel plating to form a thickness of 0.2 μm on the surface of alumina, the average particle size of which was 1.0 μm, the voltage being applied while making the substrate serve as the positive pole and using a stainless steel electrode (0.5 t) to serve as the opposite pole at a bath temperature of 23° C. and pH value of 8.5. Then, it was washed with water before being heated in an oven at 95° C.±1° C. for 90 minutes so as to be hardened. The film thickness was 25 μm and the density of the metallized ceramic powder was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

The characteristics of the thus manufactured circuit substrate were evaluated by the same method according to Example 1.

EXAMPLE 1-4

A beryllia ceramic plate having a thickness of 0.8 mm was subjected to blasting to such an extent that its surface was not damaged. Subsequently, the beryllia ceramic plate was treated with a mixed solution of 30 g/l of chromic anhydride and 100 g/l of sulfuric acid at 50° C. for 5 minutes. Subsequently, it was immersed in a catalyst liquid (trade name "HS-101B" prepared by Hitachi Kasei) for 2 minutes so that it was subjected to the catalyst process. Then, electroless copper plating liquid (prepared by Okuno) was applied with the temperature of the plating bath at 70° C. and a pH value of 13.0 for 3 minutes. In consequence, a copper plating layer having a thickness of 0.2 μm was formed.

Then, a negative type resist (trade name "OMR-83" manufactured by Tokyo Ouka) 450 cp was used so that a film having a thickness of 10 μm was formed by a spinner. Subsequently, a glass mask with a chromium pattern serving as the pattern mask was used to expose the beryllia ceramic plate to light at an intensity of 80 mJ/cm$^2$ by an exposing device which emits parallel beams before it was developed by an exclusive developer (manufactured by Tokyo Ouka) for OMR-83 for one minute. In consequence, a pattern was formed corresponding to a circuit pattern arranged in such a manner that the width of the exposed plating layer was 25 m and that of the coated portion of the photosensitive layer was 30 μm.

Then, a voltage of 120 V was applied for 3 minutes in an electrically conductive paste prepared by dispersing 67 wt % of desalinated water, 3 wt % of melamine acryl resin (trade name "Honey Bright C-IL" manufactured by Honey Kasei) and 30 wt % of a powder formed by applying nickel plating to form a thickness of 0.2 μm to the surface of alumina the average particle size of which was 1.0 μm. The voltage was applied while making the substrate serve as the positive pole and using a stainless steel electrode (0.5 t) to serve as the opposite pole at a bath temperature of 23° C. and pH value of 8.5. Then, it was washed with water before being heated in an oven at 95° C.±1° C. for 90 minutes so as to be hardened. The film thickness was 18 μm and the density of the metallized ceramic powder was 30 wt % at that time. Then, it was immersed in an exclusive separation liquid for OMR (manufactured by Tokyo Ouka) at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

The characteristics of the thus manufactured substrate were evaluated by the same method according to Example 1.

EXAMPLE 1-5

A PET (Polyethylene Terephthalate) film having a thickness of 50 μm was treated with 50 g/l of caustic soda at 60° C. for 5 minutes. Then, the PET film was treated with a mixed solution of 30 g/l of chromic anhydride and 100 g/l of sulfuric acid at 50° C. for 5 minutes. Subsequently, it was immersed in a catalyst liquid (trade name "HS-101B" prepared by Hitachi Kasei) for 2 minutes so that it was subjected to the catalyst process.

Then, a photosensitive dry film (manufactured by Hoechst A.G.) having a thickness of 70 μm was applied to the surface of the PET film by using a laminator (manufactured by Asahi Kasei). Subsequently, a film mask serving as the pattern mask was used to expose the PET film to light at an intensity of 120 mJ/cm$^2$, before it was developed by spraying with 10 g/l of sodium carbonate. In consequence, a pattern was formed corresponding to a circuit pattern arranged in such a manner that the width of the exposed plating layer was 40 μm and that of the coated portion of the photosensitive layer was 50 μm.

Subsequently, electroless copper plating liquid (prepared by Okuno) was used for plating a temperature of 70° C. at and a pH value of 13.0 for 2 minutes so that copper plating having a thickness of 0.1 μ was performed.

Then, a voltage of 170 V was applied for 3 minutes in an electrically conductive paste prepared by dispersing 15 wt % of desalinated water, 5 wt % of melamine acryl resin (trade name "Honey Bright C-IL" manufactured by Honey Kasei) and 80 wt % of powder formed by applying nickel plating to form a layer of thickness 0.2 μm on the surface of alumina, the average particle size of which was 1.0 μm. The voltage was applied while making the substrate serve as the positive pole and using a stainless steel electrode (0.5 t) to serve as the opposite pole at the bath temperature of 23° C. and pH value of 8.5. Then, it was washed with water before being heated in an oven at 95° C.±1° C. for 90 minutes so as to be hardened. The film thickness was 25 μm and the density of the metallized ceramic powder was 20 wt % at that time. Then, it was immersed in 50 g/l of caustic soda at 40° C. for 5 minutes so that the photosensitive resin was separated. Subsequently, 10% hydrochloric acid was used to remove, at 50° C. for 7 minutes, the palladium film, which was the catalyst, on the exposed portion. As a result, a fine printed circuit board was manufactured.

The characteristics of the thus manufactured substrate were evaluated by the same method according to Example 1.

EXAMPLE 1-6

The following circuit was evaluated: The circuit substrate having an electrodeposited film in which the density of powder was 50 wt %, was manufactured in a similar manner to the circuit of Example 1-1 with the exception that a powder prepared by plating copper with a thickness of 2 μm on the surface of titanium oxide, having an average particle size of 5 μm was substituted for the nickel plated alumina powder.

EXAMPLE 1-7

The following circuit was evaluated:
A circuit substrate having an electrodeposited film in which the density of powder was 55 wt %, was manufactured in a similar manner to the circuit of Example 1-1 with the exception that a powder prepared by plating copper with a thickness of 2 μm on the surface of titanium oxide having an average particle size of 0.5 μm was substituted for the nickel plated alumina powder.

EXAMPLE 1-8

A circuit substrate to be evaluated was manufactured in such a manner that the electrically conductive paste according to Example 1-1 with the exception that the electrolytic conditions were 70 V for 3 minutes and the density of the metallized ceramic in the electrodeposited film was 25 wt %.

EXAMPLE 1-9

A circuit substrate to be evaluated was manufactured in such a manner that the electrically conductive paste according to Example 1-1 with the exception that the electrolytic conditions were 180 V for 4 minutes and the density of the metallized ceramic in the electrodeposited film was 75 wt %.

EXAMPLE 1-10

A circuit substrate having an electrodeposited film in which the density of powder was 50 wt % was manufactured in a similar manner to the circuit of Example 1-1 with the exception that metallized powder was used, prepared by plating nickel with a thickness of 0.06 mm on the surface of alumina having an average particle size of 1μm, with electrolysis conducted at 170 V for 3 minutes.

EXAMPLE 1-11

The substrate with the resist pattern manufactured by the method according to Example 1-1, was subjected to the same process according to Example 1-1 in electrically conductive paste prepared by dispersing 20 wt % of desalinated water, 30 wt % of melamine acryl resin (trade name "Honey Bright C-IL" manufactured by Honey Kasei), and 50 wt % of powder formed by applying electroless gold plating to form a thickness of 0.2 μm to the surface of alumina, the average particle size of which was 1 μm. In consequence, a fine printed circuit board was obtained having an electrodeposited film in which the density of the powder was 40 wt %.

REFERENCE EXAMPLE 1

As a reference example, the substrate according to Example 1-1 was electrolyzed at 50 V for 2 minutes in electrically conductive paste prepared by dispersing 25 wt % of desalinated water, 5 wt % of melamine acryl resin (trade name "Honey Bright C-IL" manufactured by Honey Kasei) and 70 wt % of powder formed by applying nickel plating to form a thickness of 0.2 μm to the surface of alumina the average particle size of which was 1.0 μm. In consequence, a fine printed circuit board was manufactured having an electrodeposited film, in which the density of the metallized ceramic was 15 wt % after it was hardened.

REFERENCE EXAMPLE 2

The substrate according to Example 1-1 was electrolyzed at 200 V for 2 minutes in electrically conductive paste prepared by dispersing 25 wt % of desalinated water, 5 wt % of melamine acryl resin (trade name "Honey Bright C-IL" manufactured by Honey Kasei) and 70 wt % of powder formed by applying nickel plating to form a thickness of 0.2 μm to the surface of alumina the average particle size of which was 1.0 μm. In consequence, a fine printed circuit board was manufactured having an electrodeposited film, in which the density of the metallized ceramic was 85 wt % after it was hardened.

REFERENCE EXAMPLE 3

A circuit substrate having an electrodeposited film in which the density of powder was 50 wt % was manufactured in a similar manner to Example 1-1 with the exception that the thickness of the copper plating layer, on the surface of the alumina powder, was 0.02 μm.

REFERENCE EXAMPLE 4

A circuit substrate having an electrodeposited film in which the density of powder was 50 wt % was manufactured in a similar manner to Example 1-1 with the exception that the powder serving as the electrically conductive powder was prepared by applying nickel plating to form a thickness of 0.2 μm on the surface of the alumina having an average particle size of 0.07 μm.

REFERENCE EXAMPLE 5

A circuit substrate having an electrodeposited film in which the density of powder was 50 wt % was manufactured in a similar manner to Example 1-1 with the exception that the powder serving as the electrically conductive powder was prepared by applying nickel plating to form a thickness of 0.2 μm on the surface of the alumina having an average particle size of 8 μm.

The circuit substrates according to Examples 1-2 to 1-11 and reference examples 1 to 5 were evaluated similarly to Example 1-1. The results were as shown in Table 1-2.

TABLE 1-2

| Example | Initial Value | |
|---|---|---|
| | Adhesion | Specific Reistance (25° C.) |
| 1-2 | 100/100 | 5 to 6 × $10^{-5}$ [Ω · cm] |
| 1-3 | 100/100 | 6 to 7 × $10^{-5}$ [Ω · cm] |
| 1-4 | 100/100 | 5 to 6 × $10^{-5}$ [Ω · cm] |
| 1-5 | 100/100 | 3 to 4 × $10^{-4}$ [Ω · cm] |

TABLE 1-2-continued

| Example | Initial Value | |
|---|---|---|
| | Adhesion | Specific Reistance (25° C.) |
| 1-6 | 100/100 | 5 to 6 × $10^{-6}$ [Ω · cm] |
| 1-7 | 100/100 | 5 to 6 × $10^{-6}$ [Ω · cm] |
| 1-8 | 100/100 | 1 to 2 × $10^{-4}$ [Ω · cm] |
| 1-9 | 96/100 | 5 to 6 × $10^{-5}$ [Ω · cm] |
| 1-10 | 100/100 | 3 to 4 × $10^{-5}$ [Ω · cm] |
| 1-11 | 100/100 | 7 to 8 × $10^{-6}$ [Ω · cm] |
| Reference Example 1 | 60/100 | 1 to 2 × $10^{3}$ [Ω · cm] |
| Reference Example 2 | 70/100 | 7 to 8 × $10^{-5}$ [Ω · cm] |
| Reference Example 3 | 100/100 | 1 to 2 × $10^{2}$ [Ω · cm] |
| Reference Example 4 | 100/100 | 5 to 6 × $10^{1}$ [Ω · cm] |
| Reference Example 5 | 100/100 | 2 to 3 × $10^{-4}$ [Ω · cm] |

As shown Table 1-2, according to the present invention, the physical properties of the circuit substrate were significantly improved while revealing a satisfactory reproducibility.

Furthermore, satisfactory results in the durability test were obtained similarly to Example 1-1.

EXAMPLE 2-1

To a substrate having the resist pattern manufactured in Example 1-1, a voltage of 170 V was applied for 3 minutes in an electrically conductive paste prepared by dispersing 35 wt % of desalinated water, 5 wt % of melamine acryl resin (trade name "Honey Bright C-IL" manufactured by Honey Kasei) and 30 wt % of powder formed by applying nickel 100 % plating to form a thickness of 0.2 μm on the surface of alumina, the average particle size of which was 0.03 μm, and 30 wt % of nickel powder, the average size of which was 1 μm, the voltage being applied while making the substrate serve as the positive pole and using a stainless steel electrode (0.5 t) to serve as the opposite pole at a bath temperature of 23° C. and pH value of 8.5. Then, it was washed with water before being heated in an oven at 95° C. ±1° C. for 90 minutes so as to be hardened. The film thickness was 25 μm and the density of the mixed powder substance was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

The characteristics of the thus manufactured circuit substrate were evaluated by the same method according to Example 1-1.

EXAMPLE 2-2

To a substrate having the resist pattern manufactured in Example 1-2 a voltage of 180 V was applied for 3 minutes in an electrically conductive paste prepared by dispersing 25 wt % of desalinated water, 5 wt % of melamine acryl resin (trade name "Honey Bright C-IL" manufactured by Honey Kasei), 40 wt % of nickel powder, the average size of which was 0.03 μm and 30 wt % of powder formed by applying nickel plating to form a thickness of 0.5 μm on the surface of alumina, the average particle size of which was 1.0 μm. The voltage was applied while making the substrate serve as the positive pole and using a stainless steel electrode (0.5 t) to serve as the opposite pole at the bath temperature of 23° C. and pH value of 8.5. Then, it was washed with water before being heated in an oven at 95° C.±1° C. for 90 minutes so as to be hardened. The film thickness was 30 μm and the density of the powder mixed substance was 60 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 2-3

To a substrate having the resist pattern manufactured in Example 1-3 a voltage of 170 V was applied for 3 minutes in an electrically conductive paste prepared by dispersing 35 wt % of desalinated water, 5 wt % of melamine acryl resin (trade name "Honey Bright C-IL" manufactured by Honey Kasei), 30 wt % of copper powder, the average size of which was 0.03 μm and 30 wt % of powder formed by applying nickel plating to form a thickness of 0.2 μm on the surface of alumina, the average particle size of which was 1.0μ. The voltage was applied while making the substrate serve as the positive pole and using a stainless steel electrode (0.5 t) to serve as the opposite pole at the bath temperature of 23° C. and pH value of 8.5. Then, it was washed with water before being heated in an oven at 95° C.±1° C. for 90 minutes so as to be hardened. The film thickness was 25 μm and the density of the powder mixed substance was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 2-4

To a substrate having the resist pattern manufactured in Example 1-4 a voltage of 120 V was applied for 3 minutes in an electrically conductive paste prepared by dispersing 27 wt % of desalinated water, 3 wt % of melamine acryl resin (trade name "Honey Bright C-IL" manufactured by Honey Kasei), 50 wt % of silver powder, the average particle size of which was 0.07 μm and 20 wt % of powder formed by applying nickel plating to form a thickness of 0.2 μm on the surface of alumina, the average particle size of which was 1.0 μm. The voltage was applied while making the substrate serve as the positive pole and using a stainless steel electrode (0.5 t) to serve as the opposite pole at the bath temperature of 23° C. and pH value of 8.5. Then, it was washed with water before being heated in an oven at 95° C.±1° C. for 90 minutes so as to be hardened. The film thickness was 18 μm and the density of the powder mixed substance was 30 wt % at that time. Then, it was immersed in an exclusive separation liquid for OMR at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 2-5

To a substrate with the resist pattern used in Example 1-5 a voltage of 170 V was applied for 3 minutes in an electrically conductive paste prepared by dispersing 35 wt % of desalinated water, 5 wt % of melamine acryl resin (trade name "Honey Bright C-IL" manufactured by Honey Kasei), 30 wt % of copper powder, the average particle size of which was 0.03 μm and 30 wt % of powder formed by applying nickel plating to form a thickness of 0.2 μm on the surface of alumina the average particle size of which was 1.0 μm, the voltage being applied while making the substrate to serve as the positive pole and using a stainless steel electrode (0.5 t) to serve as the opposite pole at the bath temperature of 23° C. and pH value of 8.5. Then, it was washed with water before being heated in an oven at 95° C.±1° C. for 90 minutes so as to be hardened. The film thickness was 25 μm and the density of the powder mixed substance was 50 wt % at that time. Then, it was immersed in an exclusive separation liquid for OMR at 40° C. for 5 minutes so that the photosensitive resin was separated. Subsequently, 10% hydrochloric acid was used to remove the palladium film, which was the catalyst, on the exposed portion at 50° C. for 7 minutes, so that a fine printed circuit board was obtained.

The circuit substrates according to Examples 2-1 to 2-5 were evaluated similarly to Example 1-1. The results were as shown in Table 2.

TABLE 2

| | Initial Value | |
| --- | --- | --- |
| Example | Adhesion | Specific Reistance (25° C.) |
| 2-1 | 100/100 | 5 to 6 × $10^{-6}$ [Ω · cm] |
| 2-2 | 98/100 | 8 to 9 × $10^{-5}$ [Ω · cm] |
| 2-3 | 100/100 | 5 to 6 × $10^{-6}$ [Ω · cm] |
| 2-4 | 100/100 | 3 to 4 × $10^{-6}$ [Ω · cm] |
| 2-5 | 100/100 | 5 to 6 × $10^{-6}$ [Ω · cm] |

EXAMPLE 3-1

To a substrate with the resist pattern used in Example 1-1 a voltage of 170 V was applied for 3 minutes in an electrically conductive paste prepared by dispersing 65 wt % of desalinated water, 5 wt % of melamine acryl resin (trade name "Honey Bright C-IL" manufactured by Honey Kasei) and 30 wt % of powder formed by applying electroless nickel plating to form a thickness of 0.2 μm on the surface of natural mica, the average particle size of which was 2.0 μm. The voltage was applied while making the substrate serve as the positive pole and using a stainless steel electrode (0.5 t) to serve as the opposite pole at the bath temperature of 23° C. and pH value of 8.5. Then, it was washed with water before being heated in an oven at 95° C.±1° C. for 90 minutes so as to be hardened. The film thickness was 25 μm and the density of the metallized mica powder was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

In order to evaluate the performance of the thus manufactured substrate, the initial values and values after environmental testing of the specific resistance, the surface resistance and the adhesion were measured. The results are as shown in Table 3.

EXAMPLE 3-2

A fine circuit board having an electrodeposited film in which the density of the powder mixture was 50 wt % was manufactured in a similar manner to that according to Example 3-1 with the exception that the electrically conductive paste was prepared by dispersing 45 wt % of desalinated water, 5 wt % of melamine acryl resin (trade name "Honey Bright C-IL" manufactured by Honey Kasei), 30 wt % of powder formed by applying electroless nickel plating to form a thickness of 0.2 μm on the surface the average particle size of which was 1.0 μm and 20 wt % of powder formed by applying electroless nickel plating to form a thickness of 0.2 μm on the surface of natural mica, the average particle size of which was 2.0 μm.

EXAMPLE 3-3

A fine circuit board having an electrodeposited film in which the density of the powder mixture was 50 wt % was manufactured in a similar manner to that according to Example 3-1 with the exception that the electrically conductive paste was prepared by dispersing 15 wt % of desalinated water, 5 wt % of melamine acryl resin (trade name "Honey Bright C-IL" manufactured by Honey Kasei), 30 wt % of copper powder, the average particle size of which was 0.03 μm and 50 wt % of powder formed by applying electroless nickel plating to form a thickness of 0.2 μm on the surface of natural mica, the average particle size of which was 2.0 μm.

EXAMPLE 3-4

A fine circuit board having an electrodeposited film in which the density of the powder mixture was 53 wt % was manufactured in a similar manner to that according to Example 3-1 with the exception that the electrically conductive paste was prepared by dispersing 35 wt % of desalinated water, 5 wt % of melamine acryl resin (trade name "Honey Bright C-IL" manufactured by Honey Kasei), 30 wt % of copper powder, the average particle size of which was 0.03 μm, 20 wt % of powder formed by applying electroless nickel plating to form a thickness of 0.2 μm on the surface of alumina, the average particle size of which was 1.0 μm and 10 wt % of powder formed by applying electroless nickel plating to form a thickness of 0.2 μm on the surface of natural mica, the average particle size of which was 2.0 μm.

EXAMPLE 3-5

To a substrate with the resist pattern manufactured in Example 1-2 a voltage of 180 v was applied for 3 minutes in an electrically conductive paste prepared by dispersing 65 wt % of desalinated water, 5 wt % of melamine acryl resin (trade name "Honey Bright C-IL" manufactured by Honey Kasei) and 30 wt % of powder formed by applying electroless nickel plating to form a thickness of 0.05 μm on the surface of natural mica, the average particle size of which was 1.5 μm. The voltage was applied while making the substrate serve as the positive pole and using a stainless steel electrode (0.5 t) to serve as the opposite pole at a bath temperature of 23° C. and pH value of 8.5. Then, it was washed with water before being heated in an oven at 95° C.±1° C. for 90 minutes so as to be hardened. The film thickness was 30 μm and the density of the mixed powder substance was 60 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 3-6

A fine circuit board having an electrodeposited film in which the density of the powder mixture was 60 wt % was manufactured in a similar manner to that according to Example 3-5 with the exception that the electrically conductive paste was prepared by dispersing 35 wt % of desalinated water, 5 wt % of melamine acryl resin (trade name "Honey Bright C-IL" manufactured by Honey Kasei), 20 wt % of powder formed by applying electroless nickel plating to form a thickness of 0.5 μm on the surface of alumina, the average particle size of which was 1.0 μm and 40 wt % of powder formed by applying electroless nickel plating to form a thickness of 0.05 μm on the surface of natural mica, the average particle size of which was 1.5 μm.

EXAMPLE 3-7

A fine circuit board having an electrodeposited film in which the density of the powder mixture was 60 wt % was manufactured in a similar manner to that according to Example 3-5 with the exception that the electrically conductive paste was prepared by dispersing 25 wt % of desalinated water, 5 wt % of melamine acryl resin (trade name "Honey Bright C-IL" manufactured by Honey Kasei) and 40 wt % of powder formed by applying electroless nickel plating to form a thickness of 0.05 μm on the surface of natural mica the average particle size of which was 1.5 μm.

EXAMPLE 3-8

A fine circuit board having an electrodeposited film in which the density of the powder mixture was 60 wt % was manufactured in a similar manner to that according to Example 3-5 with the exception that the electrically conductive paste was prepared by dispersing 25 wt % of desalinated water, 5 wt % of melamine acryl resin (trade name "Honey Bright C-IL" manufactured by Honey Kasei), 40 wt % of nickel powder, the average size of which was 0.03 μm, 10 wt % of powder formed by applying electroless nickel plating to form a thickness of 0.5 μm on the surface of alumina the average particle size of which was 1.0 μm and 20 wt % of powder formed by applying electroless nickel plating to form a thickness of 0.05 μm on the surface of natural mica, the average particle size of which was 1.5 μm.

EXAMPLE 3-9

To a substrate with the resist pattern manufactured in Example 1-3 a voltage of 170 V was applied for 3 minutes in an electrically conductive paste prepared by dispersing 35 wt % of desalinated water, 5 wt % of melamine acryl resin (trade name "Honey Bright C-IL" manufactured by Honey Kasei) and 60 wt % of powder formed by applying electroless nickel plating to form a thickness of 0.2 μm on the surface of natural mica, the average particle size of which was 2 μm. The voltage was applied while making the substrate serve as the positive pole and using a stainless steel electrode (0.5 t) to serve as the opposite pole at a bath temperature of 23° C. and pH value of 8.5. Then, it was washed with water before heated in an oven at 95° C.±1° C. for 90 minutes so as to be hardened. The film thickness was 25 μm and the density of the mixed powder substance was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 3-10

A fine circuit board having an electrodeposited film in which the density of the powder mixture was 50 wt % was manufactured in a similar manner to that according to Example 3-9 with the exception that the electrically conductive paste was prepared by dispersing 35 wt % of desalinated water, 5 wt % of melamine acryl resin (trade name "Honey Bright C-IL" manufactured by Honey Kasei), 30 wt % of powder formed by applying electroless nickel plating to form a thickness of 0.2 µm on the surface of alumina, the average particle size of which was 1.0 µm and 30 wt % of powder formed by applying electroless nickel plating to form a thickness of 0.2 µm on the surface of natural mica, the average particle size of which was 2 µm.

EXAMPLE 3-11

A fine circuit board having an electrodeposited film in which the density of the powder mixture was 51 wt % was manufactured in a similar manner to that according to Example 3-9 with exception that the electrically conductive paste was prepared by dispersing 50 wt % of desalinated water, 5 wt % of melamine acryl resin (trade name "Honey Bright C-IL" manufactured by Honey Kasei), 20 wt % of copper powder, the average size of which was 0.03 µm and 25 wt % of powder formed by applying electroless nickel plating to form a thickness of 0.2 µm on the surface of natural mica, the average particle size of which was 2 µm.

EXAMPLE 3-12

A fine circuit board having an electrodeposited film in which the density of the powder mixture was 50 wt % was manufactured in a similar manner to that according to Example 3-9 with the exception that the electrically conductive paste was prepared by dispersing 10 wt % of desalinated water, 5 wt % of melamine acryl resin (trade name "Honey Bright C-IL" manufactured by Honey Kasei), 20 wt % of copper powder, the average particle size of which was 0.03 µm, 30 wt % of powder formed by applying electroless nickel plating to form a thickness of 0.2 µm on the surface of alumina, the average particle size of which was 1.0 µm and 35 wt % of powder formed by applying electroless nickel plating to form a thickness of 0.2 µm on the surface of natural mica, the average particle size of which was 2.0 µm.

EXAMPLE 3-13

To a substrate with the resist pattern manufactured in Example 1-4 a voltage of 120 V was applied for 3 minutes in an electrically conductive paste prepared by dispersing 37 wt % of desalinated water, 3 wt % of melamine acryl resin (trade name "Honey Bright C-IL" manufactured by Honey Kasei) and 60 wt % of powder formed by applying electroless nickel plating to form a thickness of 0.05 µm on the surface of natural mica, the average particle size of which was 2 µm, the voltage being applied while making the substrate serve as the positive pole and using a stainless steel electrode (0.5 t) to serve as the opposite pole at a bath temperature of 23° C. and pH value of 8.5. Then, it was washed with water before being heated in an oven at 95° C.±1° C. for 90 minutes so as to be hardened. The film thickness was 18 µm and the density of the mixed powder substance was 30 wt % at that time. Then, it was immersed in a separating liquid which was exclusive for the OMR at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 3-14

A fine circuit board having an electrodeposited film in which the density of the powder mixture was 30 wt % was manufactured in a similar manner to that according to Example 3-13 with the exception that the electrically conductive paste was prepared by dispersing 27 wt % of desalinated water, 3 wt % of melamine acryl resin (trade name "Honey Bright C-IL" manufactured by Honey Kasei), 20 wt % of powder formed by applying electroless nickel plating to form a thickness of 0.2 µm on the surface of alumina, the average particle size of which was 1.0 µm and 50 wt % of powder formed by applying electroless nickel plating to form a thickness of 0.05 µm on the surface of natural mica, the average particle size of which was 2.0 µm.

EXAMPLE 3-15

A fine circuit board having an electrodeposited film in which the density of the powder mixture was 30 wt % was manufactured in a similar manner to that according to Example 3-13 with the exception that the electrically conductive paste was prepared by dispersing 27 wt % of desalinated water, 3 wt % of melamine acryl resin (trade name "Honey Bright C-IL" manufactured by Honey Kasei), 40 wt % of silver powder, the average size of which was 0.07 µm and 30 wt % of powder formed by applying electroless nickel plating to form a thickness of 0.05 µm on the surface of natural mica, the average particle size of which was 2.0 µm.

EXAMPLE 3-16

A fine circuit board having an electrodeposited film in which the density of the powder mixture was 30 wt % was manufactured in a similar manner to that according to Example 3-13 with the exception that the electrically conductive paste was prepared by dispersing 27 wt % of desalinated water, 3 wt % of melamine acryl resin (trade name "Honey Bright C-IL" manufactured by Honey Kasei), 40 wt % of silver powder, the average particle size of which was 0.07 µm, 20 wt % of powder formed by applying electroless nickel plating to form a thickness of 0.2 µm on the surface of alumina, the average particle size of which was 1 0 µm and 10 wt % of powder formed by applying electroless nickel plating to form a thickness of 0.05 µm on the surface of natural mica, the average particle size of which was 2.0 µm.

EXAMPLE 3-17

To a substrate with the resist pattern manufactured in Example 1-5 a voltage of 170 V was applied for 3 minutes in an electrically conductive paste was prepared by dispersing 35 wt % of desalinated water, 5 wt % of melamine acryl resin (trade name "Honey Bright C-IL" manufactured by Honey Kasei) and 60 wt % of powder formed by applying electroless nickel plating to form a thickness of 0.1 µm on the surface of natural mica, the average particle size of which was 1.0 µm. The voltage was applied while making the substrate serve as the positive pole and using a stainless steel electrode (0.5 t)

to serve as the opposite pole at a bath temperature of 23° C. and pH value of 8.5. Then, it was washed with water before being heated in an oven at 95° C.±1° C. for 90 minutes so as to be hardened. The film thickness was 25 μm and the density of the mixed powder substance was 50 wt % at that time. Then, it was immersed in 50 g/l of caustic soda at 40° C. for 5 minutes so that the photosensitive resin was separated. Subsequently, 10% hydrochloric acid, at 50° C. for 7 minutes, was used to remove the palladium film, which was the catalyst, on the exposed portion. As a result, a fine printed circuit board was manufactured.

EXAMPLE 3-18

A fine circuit board having an electrodeposited film in which the density of the powder mixture was 50 wt % was manufactured in a similar manner to that according to Example 3-17 with the exception that the electrically conductive paste was prepared by dispersing 35 wt % of desalinated water, 5 wt % of melamine acryl resin (trade name "Honey Bright C-IL" manufactured by Honey Kasei), 20 wt % of powder formed by applying electroless nickel plating to form a thickness of 0.2 μm on the surface of alumina, the average particle size of which was 1.0 μm and 40 wt % of powder formed by applying electroless nickel plating to form a thickness of 0.1 μm on the surface of natural mica the average particle size of which was 1.0 μm.

EXAMPLE 3-19

A fine circuit board having an electrodeposited film in which the density of the powder mixture was 50 wt % was manufactured in a similar manner to that according to Example 3-17 with the exception that electrically conductive paste was prepared by dispersing 35 wt % of desalinated water, 5 wt % of melamine acryl resin (trade name "Honey Bright C-IL" manufactured by Honey Kasei), 30 wt % copper powder, the average particle size of which was 0.03 μm and 30 wt % of powder formed by applying electroless nickel plating to form a thickness of 0.1 μm on the surface of natural mica, the average particle size of which was 1.0 μm.

EXAMPLE 3-20

A fine circuit board having an electrodeposited film in which the density of the powder mixture was 50 wt % was manufactured in a similar manner to that according to Example 3-17 with the exception that the electrically conductive paste was prepared by dispersing 35 wt % of desalinated water, 5 wt % of melamine acryl resin (trade name "Honey Bright C-IL" manufactured by Honey Kasei), 30 wt % copper powder, the average particle size of which was 0.03 μm, 10 wt % of powder formed by applying electroless nickel plating to form a thickness of 0.2 μm on the surface of alumina the average particle size of which was 1.0 μm and 20 wt % of powder formed by applying electroless nickel plating to form a thickness of 0.1 μm on the surface of natural mica, the average particle size of which was 1.0 μm. The performance of the thus manufactured fine printed circuit boards according to Examples 3-1 to 3-20 were evaluated similarly to 1-1. The results are shown in Tables 3-1 and 3-2.

TABLE 3-1

| Example | Initial Value | | After durability test at 55° C. × 95% RH × 1000 hr | |
|---|---|---|---|---|
| | Adhesion | Specific Resistance (25° C.) | Adhesion | Specific Resistance |
| 3-1 | 100/100 | 7 to 8 × 10$^{-5}$ [Ω·cm] | 100/100 | 3% or Less (Resistance Change) |
| 3-2 | 100/100 | 5 to 6 × 10$^{-5}$ [Ω·cm] | 100/100 | 2% or Less (Resistance Change) |
| 3-3 | 100/100 | 5 to 6 × 10$^{-6}$ [Ω·cm] | 100/100 | 2% or Less (Resistance Change) |
| 3-4 | 100/100 | 5 to 6 × 10$^{-6}$ [Ω·cm] | 100/100 | 2% or Less (Resistance Change) |
| 3-5 | 100/100 | 3 to 4 × 10$^{-4}$ [Ω·cm] | 100/100 | 2% or Less (Resistance Change) |
| 3-6 | 100/100 | 4 to 5 × 10$^{-5}$ [Ω·cm] | 100/100 | 2% or Less (Resistance Change) |
| 3-7 | 100/100 | 1 × 10$^{-6}$ [Ω·cm] | 100/100 | 2% or Less (Resistance Change) |
| 3-8 | 100/100 | 5 to 6 × 10$^{-6}$ [Ω·cm] | 100/100 | 2% or Less (Resistance Change) |
| 3-9 | 100/100 | 5 to 6 × 10$^{-5}$ [Ω·cm] | 100/100 | 2% or Less (Resistance Change) |
| 3-10 | 100/100 | 4 to 5 × 10$^{-5}$ [Ω·cm] | 100/100 | 2% or Less (Resistance Change) |
| 3-11 | 100/100 | 5 to 6 × 10$^{-6}$ [Ω·cm] | 100/100 | 2% or Less (Resistance Change) |
| 3-12 | 100/100 | 5 to 6 × 10$^{-6}$ [Ω·cm] | 100/100 | 2% or Less (Resistance Change) |

TABLE 3-2

| Example | Initial Value | | After durability test at 55° C. × 95% RH × 1000 hr | |
|---|---|---|---|---|
| | Adhesion | Specific Resistance (25° C.) | Adhesion | Specific Resistance |
| 3-13 | 100/100 | 0.9 to 1 × 10$^{-5}$ [Ω·cm] | 100/100 | 2% or Less (Resistance Change) |
| 3-14 | 100/100 | 3 to 4 × 10$^{-5}$ [Ω·cm] | 100/100 | 2% or Less (Resistance Change) |
| 3-15 | 100/100 | 2 to 3 × 10$^{-5}$ [Ω·cm] | 100/100 | 2% or Less (Resistance Change) |
| 3-16 | 100/100 | 5 to 6 × 10$^{-5}$ [Ω·cm] | 100/100 | 2% or Less (Resistance Change) |
| 3-17 | 100/100 | 7 to 8 × 10$^{-5}$ [Ω·cm] | 100/100 | 2% or Less (Resistance Change) |
| 3-18 | 100/100 | 7 to 8 × 10$^{-5}$ [Ω·cm] | 100/100 | 2% or Less (Resistance Change) |
| 3-19 | 100/100 | 3 to 4 × 10$^{-6}$ [Ω·cm] | 100/100 | 2% or Less (Resistance Change) |
| 3-20 | 100/100 | 4 to 5 × 10$^{-6}$ [Ω·cm] | 100/100 | 2% or Less (Resistance Change) |

EXAMPLE 4-1

To a substrate having the resist pattern used in Example 1-1 a voltage of 170 V was applied for 3 minutes in an electrically conductive paste prepared by dispersing 35 wt % of desalinated water, 5 wt % of melamine acryl resin (trade name "Honey Bright C-IL" manufactured by Honey Kasei) and 60 wt % of copper powder, the average particle size of which was 0.03 μm. The voltage was applied while making the substrate serve as the positive pole and using a stainless steel electrode (0.5 t) to serve as the opposite pole at a bath temperature of 23° C. and pH value of 8.5. Then, it was washed with water before being heated in an oven at 150° C.±1° C. for 90 minutes so as to be hardened. The film thickness was 25 μm and the density of the metal powder was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 4-2

To a substrate having the resist pattern used in Example 1-2 a voltage of 180 V was applied for 3 minutes in an electrically conductive paste prepared by dispersing 25 wt % of desalinated water, 5 wt % of melamine acryl resin (trade name "Honey Bright C-IL" manufactured by Honey Kasei) and 70 wt % of nickel powder, the average particle size of which was 0.03 μm. The voltage was applied while making the substrate serve as the positive pole and using a stainless steel electrode (0.5 t) to serve as the opposite pole at a bath temperature of 23° C. and pH value of 8.5. Then, it was washed with water before being heated in an oven at 145° C.±1° C. for 90 minutes so as to be hardened. The film thickness was 30 μm and the density of the metal powder was 60 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 4-3

To a substrate having the resist pattern used in Example 1-3 a voltage of 170 V was applied for 3 minutes in an electrically conductive paste prepared by dispersing 15 wt % of desalinated water, 5 wt % of melamine acryl resin (trade name "Honey Bright C-IL" manufactured by Honey Kasei) and 80 wt % of copper powder, the average particle size of which was 0.03 μm. The voltage was applied while making the substrate serve as the positive pole and using a stainless steel electrode (0.5 t) to serve as the opposite pole at a bath temperature of 23° C. and pH value of 8.5. Then, it was washed with water before being heated in an oven at 145° C.±1° C. for 90 minutes so as to be hardened. The film thickness was 25 μm and the density of the metal powder was 50 wt % at that time. Then, it was immersed in 50 g/l of caustic soda at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 4-4

To a substrate having the resist pattern used in Example 1-4 a voltage of 120 V was applied for 3 minutes in an electrically conductive paste prepared by dispersing 47 wt % of desalinated water, 3 wt % of melamine acryl resin (trade name "Honey Bright C-IL" manufactured by Honey Kasei) and 50 wt % of silver powder, the average particle size of which was 0.07 μm. The voltage was applied while making the substrate serve as the positive pole and using a stainless steel electrode (0.5 t) to serve as the opposite pole at a bath temperature of 23° C. and pH value of 8.5. Then, it was washed with water before being heated in an oven at 145° C.±1° C. for 90 minutes so as to be hardened. The film thickness was 18 μm and the density of the metal powder was 30 wt % at that time. Then, it was immersed in an exclusive separating liquid for the OMR at 40° C. for 5 minutes so that the photosensitive resin was separated. Subsequently, ammonic alkaline copper liquid was used to remove the copper plating film on the exposed portion at 50° C. for 7 minutes so that a fine printed circuit board was obtained.

EXAMPLE 4-5

To a substrate having the resist pattern used in Example 1-5 a voltage of 170 V was applied for 3 minutes in an electrically conductive paste prepared by dispersing 35 wt % of desalinated water, 5 wt % of melamine acryl resin (trade name "Honey Bright C-IL" manufactured by Honey Kasei) and 60 wt % of copper powder, the average particle size of which was 0.03 μm. The voltage was applied while making the substrate serve as the positive pole and using a stainless steel electrode (0.5 t) to serve as the opposite pole at a bath temperature of 23° C. and pH value of 8.5. Then, it was washed with water before being heated in an oven at 145° C.±1° C. for 90 minutes so as to be hardened. The powder had been treated with a surface active agent. The film thickness was 25 μm and the density of the metal powder was 50 wt % at that time. Then, it was immersed in 50 g/l of caustic soda at 40° C. for 5 minutes so that the photosensitive resin was separated. Subsequently, 10% hydrochloric acid was used to remove, at 50° C. for 7 minutes, the palladium film, which was the catalyst, on the exposed portion. As a result, a fine printed circuit board was manufactured.

The characteristics of the thus manufactured substrate according to Examples 4-1 to 4-5 were evaluated by the same method according to Example 1-1. The results are shown in Table 4.

TABLE 4

| | Initial Value | | After durability test at 55° C. × 95% RH × 1000 hr | |
|---|---|---|---|---|
| Example | Adhesion | Specific Resistance (25° C.) | Adhesion | Specific Resistance |
| 4-1 | 98/100 | 2 to 3 × $10^{-4}$ [Ω · cm] | 98/100 | Raised by 5% (Resistance Change) |
| 4-2 | 96/100 | 1 to 2 × $10^{-3}$ [Ω · cm] | 95/100 | Raised by 4% (Resistance Change) |
| 4-3 | 100/100 | 3 to 4 × $10^{-4}$ [Ω · cm] | 97/100 | Raised by 4% (Resistance Change) |
| 4-4 | 98/100 | 3 to 4 × $10^{-3}$ [Ω · cm] | 98/100 | Raised by 3% (Resistance Change) |
| 4-5 | 98/100 | 3 to 4 × $10^{-4}$ [Ω · cm] | 98/100 | 2% or Less (Resistance Change) |

Although the invention has been described in its preferred form with a certain degree of particularly, it is understood that the present disclosure is not limited to the examples set forth herein. The details of construction and the combination and arrangement of parts may be varied without departing from the spirit and the scope of the invention as hereinafter claimed.

What is claimed is:

1. A method of manufacturing an electrically conductive circuit member having an electrically conductive circuit in a pattern on an insulating substrate comprising:
   (a) forming a plating layer on said insulating substrate:
   (b) forming a resist pattern corresponding to a circuit pattern on said plating layer
   (c) performing an electrodeposition, said plating layer serving as an electrode, while simultaneously immersing said insulating substrate into an electrically conductive paste comprising a resin and electrically conductive particles, which are electrically deposited on said plating player that does not contain the resist pattern to selectively form an electrodeposited film comprising said resin and said electrically conductive particles;
(d) conducting a heating and hardening of said electrodeposited film; and
(e) removing said plating layer from said insulating substrate except for portions upon which the electrodeposited film has been formed.

2. A method of manufacturing an electrically conductive circuit member according to claim 1, including forming said plating layer in a thickness between about 0.1 μm and 1 μm.

3. A method of manufacturing an electrically conductive circuit member according to claim 1, including forming said plating layer in a thickness between about 0.1 μm and 1 μm.

4. A method of manufacturing an electrically conductive circuit member according to claim 1, including conducting said heating process at a temperature between about 90° C. and 100° C.

5. A method of manufacturing an electrically conductive circuit member according to claim 1, including forming said electrodeposited film, which has been subjected to said heating process, to contain said electrically conductive particles in an amount of about 20 to 80 % by weight.

6. A method of manufacturing an electrically conductive circuit member according to claim 1, including employing said electrically conductive particles which are selected from the group consisting of powder prepared by metallizing the surface of ceramic powder, powder prepared by metallizing the surface of natural mica powder or mixture thereof.

7. A method of manufacturing an electrically conductive circuit member according to claim 6, wherein the average particle size of said ceramic powder is from about 0.1 to 7 μm.

8. A method of manufacturing an electrically conductive circuit member according to claim 6, wherein the average particle size of said natural mica powder is from about 0.1 to 7 μm.

9. A method of manufacturing an electrically conductive circuit member according to claim 6, wherein said electrically conductive particles further comprise superfine metal powder, the average particle size of which is from about 0.01 to 5 μm.

* * * * *

UNITED STATES PATENT AND TRADEMARK OFFICE
CERTIFICATE OF CORRECTION

PATENT NO. : 5,234,558
DATED : August 10, 1993
INVENTOR(S) : SUSUMU KADOKURA

It is certified that error appears in the above-identified patent and that said Letters Patent is hereby corrected as shown below:

COLUMN 3

Line 27, "be" should be deleted.

COLUMN 4

Line 10, "according" should read --according to--.
    Line 60, "phologopite," should read --phlogopite,--.

COLUMN 5

Line 39, "tot eh" should read --to the--.
    Line 45, "by" should read --be--.

COLUMN 6

Line 13, "preferably" should read --preferable--.

COLUMN 9

Line 36, "IC." should read --IC--.

COLUMN 13

Line 1, "m" should read -- μm--.
    Line 53, "0.1 μwas" should read --0.1 μm was--.

COLUMN 16

Line 19, "shown" should read --shown in--.

--

UNITED STATES PATENT AND TRADEMARK OFFICE
CERTIFICATE OF CORRECTION

PATENT NO. : 5,234,558
DATED : August 10, 1993
INVENTOR(S) : SUSUMU KADOKURA

It is certified that error appears in the above-identified patent and that said Letters Patent is hereby corrected as shown below:

COLUMN 19

Line 7, "surface" should read --surface of alumina,--.

COLUMN 22

Line 51, "1 0 µm" should read --1.0 µm--.

COLUMN 26

Line 47, "particularly" should read --particularity--.
　　Line 60, "strate:" should read --strate;--.
　　Line 62, "layer" should read --layer;--.
　　Line 68, "player" should read  --layer--.

Signed and Sealed this

Twelfth Day of April, 1994

Attest:

BRUCE LEHMAN

Attesting Officer　　　Commissioner of Patents and Trademarks